United States Patent [19]
Haraszti et al.

[11] 3,942,171
[45] Mar. 2, 1976

[54] SCANNING SYSTEM FOR DIGITAL-ANALOG CONVERTER

[75] Inventors: Tegze P. Haraszti; Wiley Preston Snuggs, both of Houston, Tex.

[73] Assignee: Texas Instruments Incorporated, Dallas, Tex.

[22] Filed: Apr. 3, 1974

[21] Appl. No.: 457,664

[52] U.S. Cl. 340/347 DA; 235/92 DM; 235/92 SH; 235/165; 307/221 R
[51] Int. Cl.² ........................................ H03K 13/02
[58] Field of Search .......... 235/156, 164, 165, 194, 235/92 DM, 92 SH; 340/347 DA; 307/221 R

[56] References Cited
UNITED STATES PATENTS

| | | | |
|---|---|---|---|
| 2,907,021 | 9/1959 | Woods | 340/347 DA |
| 3,110,894 | 12/1963 | Murgio | 340/347 DA |
| 3,230,353 | 1/1966 | Greene et al. | 235/164 X |

OTHER PUBLICATIONS
Schmid, "Electronic Analog/Digital Conversions," Van Nostrand Reinhold Co., 7/1971, pp. 206–216.

*Primary Examiner*—Thomas J. Sloyan
*Attorney, Agent, or Firm*—Harold Levine; James T. Comfort; James O. Dixon

[57] ABSTRACT

A digital scanning system for a digital to analog converter. The scanning system includes an information counter for storing a plurality of digital bits I1, I2, I3....IN, with bit I1 being the most significant bit and bit IN being the least significant bit. Logic gates are connected between the information and interconnected shift registers. A clock applies clock frequency signals to the shift registers such that the digital bits are output in the periodic sequence I1, I2, I1, I3, I1, I2, I1, I4, I1, I2, I1, I3, I1...I1, I2, I1, IN. The periodic sequence of digital bits is applied to an integrator which outputs a voltage level representative of the periodic sequence.

4 Claims, 8 Drawing Figures

THE PRIOR ART

SCANNING SYSTEM FOR DIGITAL-ANALOG CONVERTER

FIELD OF THE INVENTION

This invention relates to a digital scanning system, and more particularly relates to a digital scanning system for a digital to analog converter which is operable at a high frequency.

THE PRIOR ART

Systems have been heretofore developed to provide electronic tuning of multichannel devices such as radio, television and the like. In such prior systems, a plurality of binary coded digital words are stored in a memory. Upon actuation of a switch, a selected one of the binary coded digital words is applied to a digital to analog converter and converted to a D.C. voltage. This voltage is utilized to control a selected varactor tuner to provide band selection and the like.

Several different types of digital to analog converters have been previously utilized in such electronic tuning systems. For example, one prior system utilized a free running counter, with magnitude comparison being performed against a predetermined voltage in order to generate a modulated pulse waveform. The modulated pulse waveform was then integrated to provide a desired D.C. voltage for varactor tuner control.

In another prior digital to analog system, a scanning counter including a plurality of discrete synchronous binary counter cells was interconnected through logic gates to an information counter including a plurality of up/down binary counters. A memory was operable to store any of several digital words in the information counter. The scanning counter was driven from an external clock pulse and controlled the logic gates to transfer the digital data from the information counter to an output in a predetermined output sequence. The output sequence was then applied to a filter which transformed the duty cycle of the output signal to a D.C. voltage for the varactor tuner control. In this prior system, the input of the scanning counter was required to be driven synchronously with other portions of the system with the same oscillator. This requirement that the scanning circuit include synchronous binary counters resulted in slow operating frequencies for the system. Moreover, the requirement of synchronous binary counters required a plurality of logic gates which resulted in high power dissipation and a large semiconductor chip area, thus rendering this prior circuit uneconomical for high production manufacture and use.

SUMMARY OF THE INVENTION

In accordance with the present invention, a scanning system is provided for use with a digital to analog converter and which is operable at high frequencies, has low power dissipation and is suitable for large scale integration to substantially reduce the semiconductor chip area required for manufacture.

In accordance with a more specific aspect of the invention, a scanning system for a digital to analog converter includes an information counter for storing a plurality of digital bits I1, I2, I3...IN, with bit I1 being the most significant bit and bit IN being the least significant bit. A shift register is connected through gates to the information counter. A clock applies high frequency clock signals to the gates and the shift register such that the digital bits are output from the system in the periodic sequence, I1, I2, I1, I3, I1, I2, I1, I4, I1, I2, I1, I3, I1...I1, I2, I1, IN.

DESCRIPTION OF THE DRAWINGS

For a more complete understanding of the present invention and for further objects and advantages thereof, reference may now be made to the following description taken in conjunction with the accompanying Drawings, in which.

DESCRIPTION OF THE PREFERRED EMBODIMENT

Figure 1:
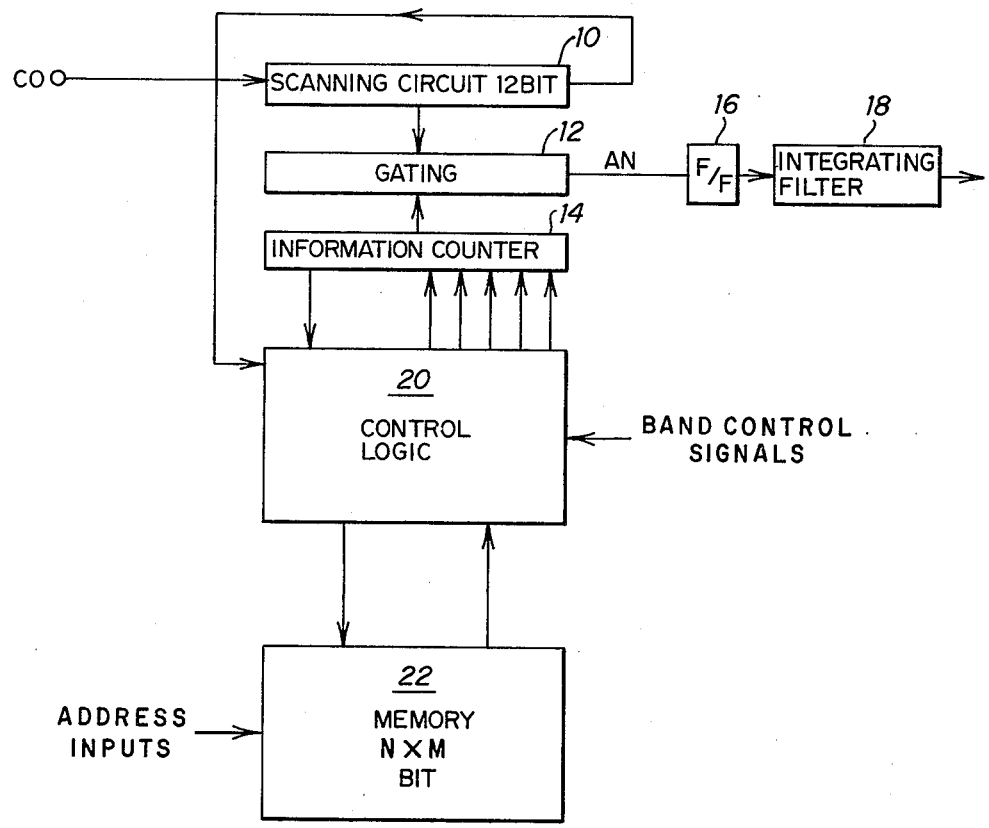
FIG. 1 is a block diagram of a digital to analog converter for controlling varactor tuners.

FIG. 1 is a block diagram of a digital to analog converter which is useful to control varactor tuners in a multichannel radio or television system. The converter includes a scanning circuit 10 which in the preferred embodiment comprises a 12 stage shift register. The scanning circuit 10 is connected to logic gating 12 which operates to gate digital information stored in an information counter 14. A clock CO drives the scanning circuit 10 and gating 12 at a high frequency, which in the preferred embodiment is 1MHz. The output of the gating circuit 12 is a digital pulse train applied as the AN output to a flipflop 16 which operates to store the digital output for application to an integrating filter 18. Filter 18 transforms the duty cycle of the AN output digital pulse train to a D.C. voltage for control of varactor tuners.

It may thus be seen that the function of the scanning circuit 10 is to transform the parallel digital word stored in the information counter 14 into a digital pulse train having a time relationship to enable time averaging by the integrating filter 18. In addition, as will be later described, it is important that the pulse train have a high ripple frequency such that the integrating capaciter in the filter may be as small and therefore as inexpensive as possible.

Control logic 20 is interconnected between the information counter 14 and an N x M bit memory 22. The control logic 20 is also connected to receive Band Control Signals and search activation inputs.

Address inputs and a search mode control output are applied to the control logic 20.

In operation of the system shown in FIG. 1, the memory 22 enables the user to store a plurality of N different binary coded 12-bit words which contain D.C. voltage information and controls for the supply of the different varactor tuners to be controlled. Any one of the N words may be selected by the Address Inputs and inserted from memory 22 into the information counter 14. Additional bits may be input as Band Control Signals to logic 20 to provide information for band selection.

For the initial setup of the memory 22, and for further reprogramming, a search mode function is incorporated into the system. By external activation of the Band Selection Signals, the search mode is activated. In the search mode, the count of the information counter 14 is increased with a speed faster than the AFC function in which a specific band is operating. During the search mode, an output SM will be activated to switch the integration time constant of the filter 18. During the search mode, a short time constant of the filter is needed for fast response of the tuner control voltage. However, in normal operation a long time constant will reduce the ripple of the integrated pulse train.

When the selected word from memory 22 has been loaded by the control logic 20 into the information counter 14, the 12-bit scanning circuit 10 operates in conjunction with the gating circuit 12 to generate an output pulse stream AN which comprises a periodic sequence of the data stored in the information counter 14. An important aspect of the periodic sequence is that the recurrence of the digital bits in the sequence is dependent upon the significance of the bits. In the preferred sequence, assuming that 4-bits A, B, C and D are stored in the counter 14, and bit A is the most significant bit and bit D is the least significant bit, the output sequence AN would comprise A, B, A, C, A, B, A, D, A, B, A, C, A, B, A in each scanning cycle. This distribution of the digital data stored in the information counter 14 provides the highest possible ripple frequency for each bit by splitting the data stored in the information counter 14 into individual bits evenly spread over a total scanning cycle in dependence upon the significances of the bits. For example, the most significant bit A appears evenly throughout the sequence eight times, bit B appears symmetrially four times, bit C appears evenly two times and the least significant bit D appears only once. Of course, it will be understood that other periodic sequences, wherein the recurrence of the bits is also dependent upon the bit significance, may be output using the present inventive concept.

The output pulse stream AN is applied to the flip-flop 16 and to the integrating filter 18 which integrates the particular pulse stream into a voltage for control of the varactor tuners. The present system thus provides a very accurate digital to analog conversion.

A very important portion of the system shown in FIG. 1 is the scanning circuit 10. In particular, it is important that the scanning circuit be operable at a high frequency, yet require a minimum of gates to provide low power dissipation and enable large scale integration during manufacture.

Figure 2:
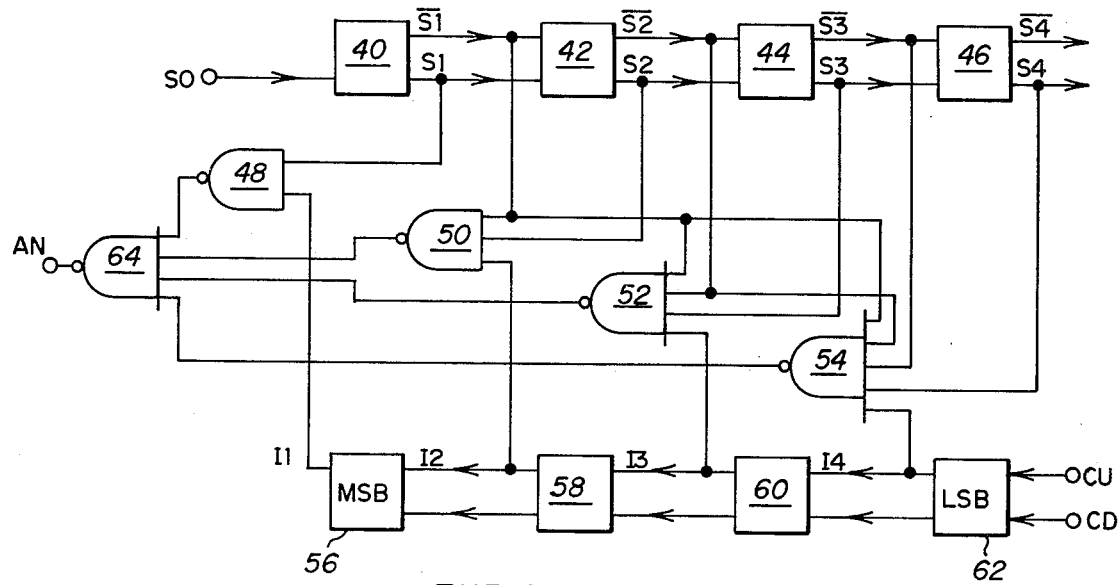
FIG. 2 illustrates a prior art scanning circuit.

FIG. 2 illustrates a Prior Art device utilized to provide the scanning function in the circuit of FIG. 1. While in the preferred embodiment the scanning circuitry of the invention must operate upon twelve digital bits, for simplicity of illustration FIG. 2 illustrates 4-bit operation. The Prior Art system shown in FIG. 2 includes four synchronous binary counters 40, 42, 44 and 46. These counters are driven by a clock pulse SO. The resulting outputs from the binary counters, S1-S4 and S1-S4, are applied to drive AND gates 48, 50, 52 and 54 which operate as comparator logic. The information counter comprises four up/down binary counters 56, 58, 60 and 62, with the most significant bit being stored in the counter 56 and the least significant bit being stored in counter 62. Count up CU and count down CD signals are applied to the counter 62. The outputs from the counters 56-62 are applied to inputs of the gates 48-54. The outputs of gates 48-54 are applied to a multi-input NAND gate 64 which provides the AN output.

The system shown in FIG. 2 operates to generate a periodic sequence of the bits stored in the information counter. This sequence is illustrated in the following truthtable for operation of the system shown in FIG. 2.

TABLE I

| | | | | | Truthtable | | | | | |
|---|---|---|---|---|---|---|---|---|---|---|
| t | $S_0$ | $S_1$ | $S_2$ | $S_3$ | $S_4$ | $G_1$ | $G_2$ | $G_3$ | $G_4$ | AN |
| 1  | 0 | 0 | 0 | 0 | 0 | 0 | 0 | 0 | 0 | 0 |
| 2  | 1 | 0 | 0 | 0 | 0 | 0 | 0 | 0 | 0 | 0 |
| 3  | 0 | 1 | 0 | 0 | 0 | 1 | 0 | 0 | 0 | 11 |
| 4  | 1 | 1 | 0 | 0 | 0 | 1 | 0 | 0 | 0 | 11 |
| 5  | 0 | 0 | 1 | 0 | 0 | 0 | 1 | 0 | 0 | 12 |
| 6  | 1 | 0 | 1 | 0 | 0 | 0 | 1 | 0 | 0 | 12 |
| 7  | 0 | 1 | 1 | 0 | 0 | 1 | 0 | 0 | 0 | 11 |
| 8  | 1 | 1 | 1 | 0 | 0 | 1 | 0 | 0 | 0 | 11 |
| 9  | 0 | 0 | 0 | 1 | 0 | 0 | 0 | 1 | 0 | 13 |
| 10 | 1 | 0 | 0 | 1 | 0 | 0 | 0 | 1 | 0 | 13 |
| 11 | 0 | 1 | 0 | 1 | 0 | 1 | 0 | 0 | 0 | 11 |
| 12 | 1 | 1 | 0 | 1 | 0 | 1 | 0 | 0 | 0 | 11 |
| 13 | 0 | 0 | 1 | 1 | 0 | 0 | 1 | 0 | 0 | 12 |
| 14 | 1 | 0 | 1 | 1 | 0 | 0 | 1 | 0 | 0 | 12 |
| 15 | 0 | 1 | 1 | 1 | 0 | 1 | 0 | 0 | 0 | 11 |
| 16 | 1 | 1 | 1 | 1 | 0 | 1 | 0 | 0 | 0 | 11 |
| 17 | 0 | 0 | 0 | 0 | 1 | 0 | 0 | 0 | 1 | 14 |
| 18 | 1 | 0 | 0 | 0 | 1 | 0 | 0 | 0 | 1 | 14 |
| 19 | 0 | 1 | 0 | 0 | 1 | 1 | 0 | 0 | 0 | 11 |
| 20 | 1 | 1 | 0 | 0 | 1 | 1 | 0 | 0 | 0 | 11 |
| 21 | 0 | 0 | 1 | 0 | 1 | 0 | 1 | 0 | 0 | 12 |
| 22 | 1 | 0 | 1 | 0 | 1 | 0 | 1 | 0 | 0 | 12 |
| 23 | 0 | 1 | 1 | 0 | 1 | 1 | 0 | 0 | 0 | 11 |
| 24 | 1 | 1 | 1 | 0 | 1 | 1 | 0 | 0 | 0 | 11 |
| 25 | 0 | 0 | 0 | 1 | 1 | 0 | 0 | 1 | 0 | 13 |
| 26 | 1 | 0 | 0 | 1 | 1 | 0 | 0 | 1 | 0 | 13 |
| 27 | 0 | 1 | 0 | 1 | 1 | 1 | 0 | 0 | 0 | 11 |
| 28 | 1 | 1 | 0 | 1 | 1 | 1 | 0 | 0 | 0 | 11 |
| 29 | 0 | 0 | 1 | 1 | 1 | 0 | 1 | 0 | 0 | 12 |
| 30 | 1 | 0 | 1 | 1 | 1 | 0 | 1 | 0 | 0 | 12 |
| 31 | 0 | 1 | 1 | 1 | 1 | 1 | 0 | 0 | 0 | 11 |
| 32 | 1 | 1 | 1 | 1 | 1 | 1 | 0 | 0 | 0 | 11 |
| 33 | 0 | 0 | 0 | 0 | 0 | 0 | 0 | 0 | 0 | 0 |
| 34 | 1 | 0 | 0 | 0 | 0 | 0 | 0 | 0 | 0 | 0 |
| 35 | 0 | 1 | 0 | 0 | 0 | 1 | 0 | 0 | 0 | 0 |

The Boolean equations for the transfer gate function of a 12-bit system in accordance with the prior system of FIG. 2 are:

$G_1 = S_1$                    1
$G_2 = S_2 * S_1$         2
$G_3 = S_3 * S_2 * S_1$    3
$G_{12} = S_{12} * S_{11} * S_{10} ... * S_2 * S_1$    4

A logical one at $G_1$ passes the information of the most significant bit (I1) of the information counter to the output AN, a logical one at $G_2$ passes the second MSB I2 to AN and so forth to the least significant bit I12. Thus, $$AN = G_1 * I_1 + G_2 * I_2 + ... G_{11} * I_{11} - G_{12} * I_{12}$$

(5)

Problems, however, arise when the prior art circuit shown in FIG. 2 is attempted to be utilized in a production system. The input of the binary counters shown in FIG. 2 and the clock input of the flipflop 16 (FIG. 1) are driven synchronously from the same oscillator. This requirement of synchronous binary counters in the prior art system of FIG. 2, in addition to the large number of logic gates and gate inputs required, results in a slow operational frequency or to large bar size. Moreover, the circuitry required for the synchronous binary counters results in a high power dissipation and a relatively large semiconductor chip area. Such synchronous binary counters and the required logic circuitry are not adapted to large scale integration and particularly are not adapted to MOS circuit manufacture techniques.

Figure 3:
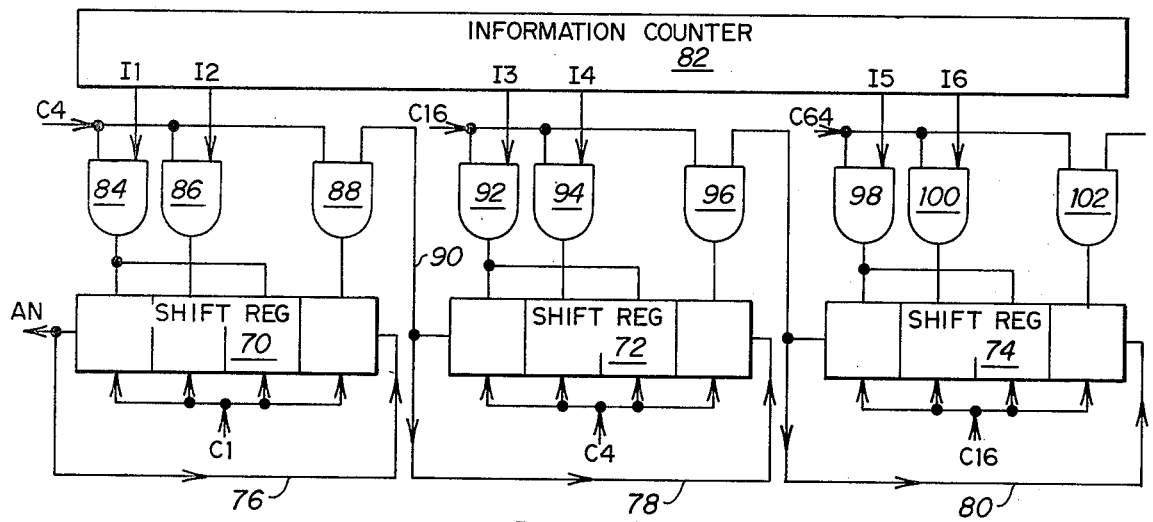
FIG. 3 is a schematic diagram of the preferred improved scanning circuit of the invention.

FIG. 3 illustrates in schematic detail the preferred embodiment of a scanning circuit according to the invention. Instead of synchronous binary counters and instead of the gating 12, the present scanning circuit utilizes three four-stage shift registers 70, 72 and 74 and a minimum number of simple logic gates. The output of each shift register is connected to the input of that shift register by feedback loops 76, 78 and 80 to form ring configurations. A first clock frequency C1, which in the preferred embodiment is 1MHz, is applied to the stages of shift register 70 and a second clock frequency C4 having one-fourth the frequency of clock C1 is applied to the stages of shift register 72. A clock frequency C16 which has one-sixteenth the frequency of frequency C1 is applied to the stages of shift register 74.

An information counter 82, which comprises up/down binary counters counting cells in the manner as shown in FIG. 1, has stored therein six digital bits I1-I6, with I1 being the most significant bit and bit I6 being the least significant bit. Only six bits are utilized in FIG. 3 for simplicity of illustration. Bits I1 and I2 are applied to inputs of AND gates 84 and 86, the outputs of the gates being applied to the first two stages of the shift register 70. The output of gate 84 is also applied to the third stage of shift register 70. Clock pulses C4 are applied to the second inputs of gates 84 and 86 and are also applied to an input of an AND gate 88. The output of gate 88 is applied to the fourth stage of the shift register 70. The second input of gate 88 is applied from the output of shift register 72 via lead 90. AND gates 92 and 94 receive data bits I3 and I4 from the information counter 82 and also receive clock pulses C16. The output of gate 92 is applied to the first and third stages of shift register 72, while the output of the gate 94 is applied to the second stage of the shift register 72. Clock pulses C16 are also applied to an input of an AND gate 96, the output of which is applied to the fourth stage of the shift register 72. The second input of gate 96 is applied from the output of shift register 74. In a similar manner, AND gates 98 and 100 receive inputs from the data bits I5 and I6 and from the clock frequency C64. The output of gates 98 and 100 are applied to the first three stages of the shift register 74. Clock C64 is also applied to an input of an AND gate 102, the output of which is applied to the fourth stage of the shift register 74. The second input of gate 102 is connected to subsequent stages of the circuit.

Figure 4:
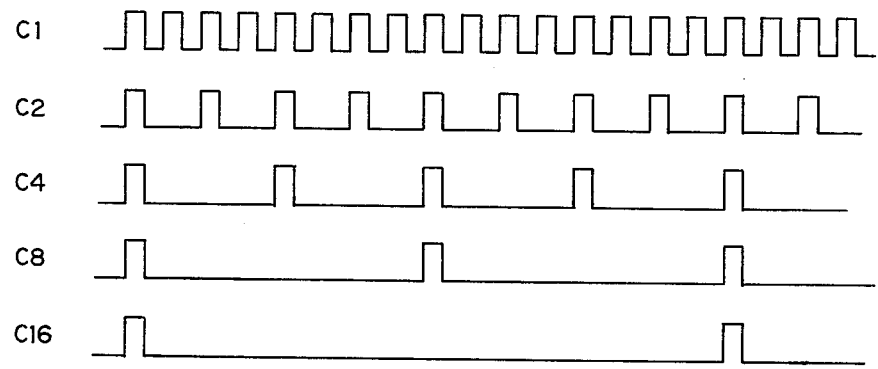
FIG. 4 is a timing diagram of the clock pulses utilized in the scanning circuit shown in FIG. 3.

FIG. 4 illustrates a timing diagram for the clock pulses utilized with the scanning circuit shown in FIG. 3. As may be seen, clock pulse C8 has twice the frequency of clock pulse C16. Clock pulse C4 has twice the frequency of clock pulse C8, and clock pulse C1 has four times the frequency of clock pulse C4. In the preferred embodiment, C1 has a nominal frequency of 1MHz.

Figure 5:
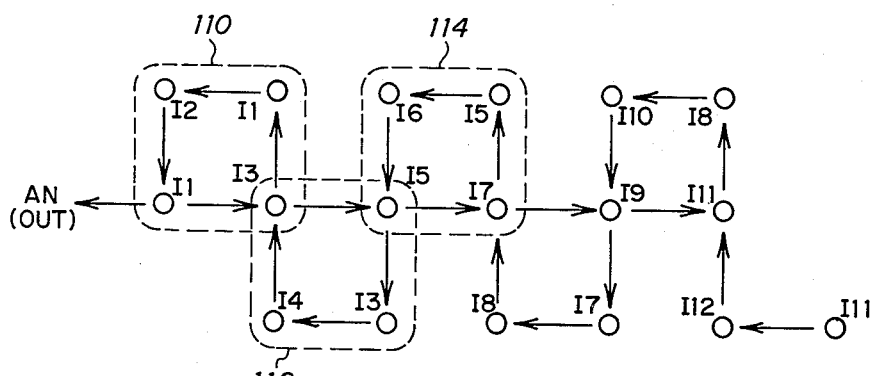
FIG. 5 is a flow diagram of the station memories of the scanning circuit shown in FIG. 3 during operation.

FIG. 5 is a flow diagram which assists in understanding of the operation of the scanning circuit shown in FIG. 3. The information bits stored in the information counter are illustrated in the flow diagram with the circles illustrating the stable stages of the data within the system. In operation of the scanning circuit, the information data is moved in the direction of the arrows, such that the shift frequency for the first four bits I1, I2, I1 and I3 (illustrated by the dotted line 110) moves four times faster than the second four bit group I3, I4, I3 and I5 (illustrated by the dotted line 112). Similarly, the second group of data (dotted line 112) moves four times as fast as the shift frequency of the third group of bits I5, I6, I5 and I7 (illustrated by the dotted line 114). At each fourth shift, data is shifted from each group to the adjacent faster four bit group.

At the output AN, after the bit I1 first appears, after the first shift pulse, the bit I2 will appear. After the second shift pulse, the bit I1 will appear and after the third shift pulse the bit I3 will appear. After the fourth shift pulse, the bit I1 will again appear and at the fifth shift pulse the bit I2 will again appear, and so on.

In operation of the circuitry shown in FIG. 3, the data bits I1-I6 are transferred to the information counter 14 from the memory. The clock pulses cause the data within the information counter 82 to be shifted through the logic AND gates into the shift register 70. At the first clock pulse, the bit I1 appears at the output AN. Subsequent clocking of the system results in the sequence I2, I1, I3, I1, I2, I1, I4, I1, I2, I1, I3, I1...I1, I2, I1, I6 to appear at the output AN. This sequence is periodic and occurs during each scanning cycle in a periodic manner. As noted above, the provision of the output sequence by the present scanning circuit provides the highest possible ripple frequency for each bit stored in the information counter by splitting the information into the individual pulses which are evenly spread over the total scanning cycle in dependence upon the significance of the information.

For example, as may be seen from the sequence, the most significant bit I1 appears with the most frequency in the sequence, with the least significant bit I6 appearing with the least frequency. It has been found that provision of such a periodic sequence having a high ripple frequency for all bits provides a very accurate resulting voltage level after integration to provide accurate tuner control. Moreover, the high ripple frequency enables the use of a small and inexpensive integrating capacitor. The shift registers 70, 72 and 74, and the limited number of gates, may be very easily fabricated by present MOS techniques, thereby resulting in relatively low heat dissipation and enabling large scale integration. In addition, the present scanning circuit is operable at a higher frequency than the prior art scanning circuits.

Figure 6:
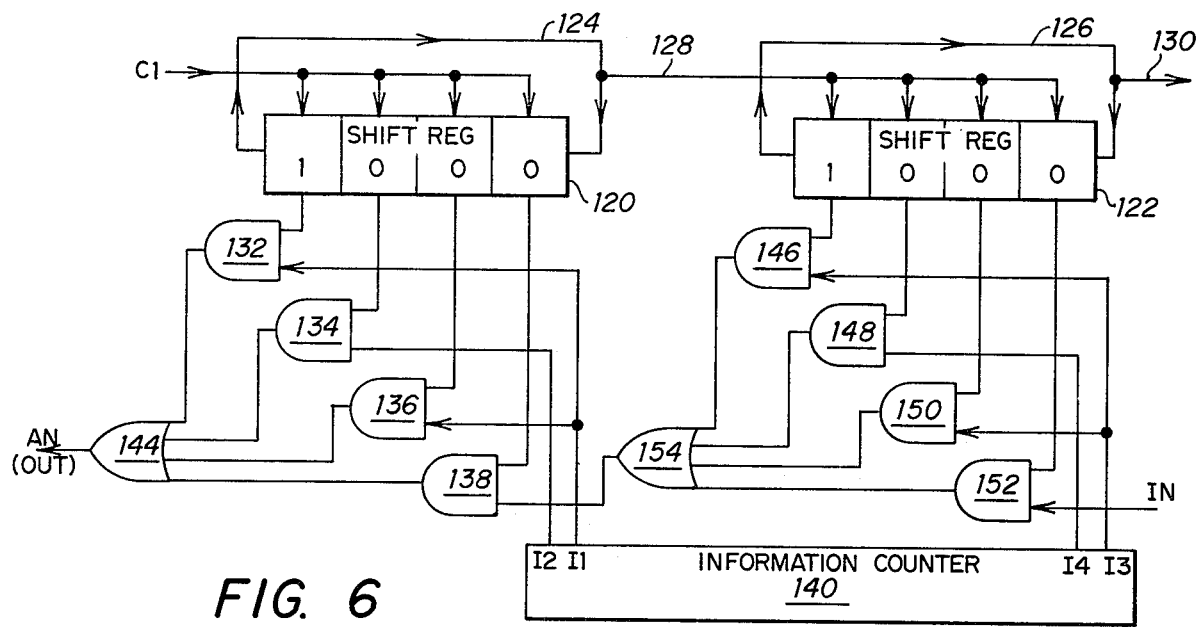
FIG. 6 is a schematic diagram of a second embodiment of the scanning circuit of the invention.

FIG. 6 illustrates a second embodiment of a scanning circuit for use in accordance with the invention. This circuit is advantageous in that it requires only a single clock frequency, as each shift register group is clocked by the previous shift register group. Referring to FIG. 6, a pair of four stage shift registers 120 and 122 are illustrated, with the output of the registers being connected with the input of the registers in a ring configuration by feedback loops 124 and 126. A single clock frequency C1 (FIG. 4) is applied to all stages of shift register 120. The output of shift register 120 is applied via lead 128 to provide clocking for the stages of the shift register 122. In a similar manner, the output of shift register 122 is applied to the subsequent stage via lead 130 to provide clocking.

Each stage of shift register 120 is respectively connected to one of AND gates 132-138. In addition, inputs of gates 132 and 136 are interconnected and receive digital bit I1 from the information counter 140. Gate 134 receives digital bit I2 from the information counter. The output of gates 132-138 are connected to a multi-input OR gate 144, the output of which is the AN output of the system.

The stages of the shift register 122 are respectively connected to inputs of AND gates 146, 148, 150 and 152. The digital bit I3 is applied to inputs of gates 146 and 150 from the information counter 140. The data bit I4 is applied to an input of gate 148. The outputs of the gates 146-152 are applied to a four input OR gate 154, the output of which is applied to an input of gate 138. Outputs from additional stages are received by an input 152.

In operation of the circuit shown in FIG. 6, a logic one is initially input into the first stage of each of the shift registers 120 and 122. As the logic one is circulated through each shift register, it operates to open the AND gate connected to the associated stage of the shift register. The opening of the AND gate causes the digital data from the information counter 140 to be applied to the AN output. The periodic sequence which appears at the output AN of the circuit of FIG. 6 is identical to the sequence appearing at the output of the circuit shown in FIG. 3. In other words, for bits I1-I4 stored in the information counter, with bit I4 being the most significant bit, the periodic output sequence appearing at AN would be I1, I2, I1, I3, I1, I2, I1, I4....

Figure 7:
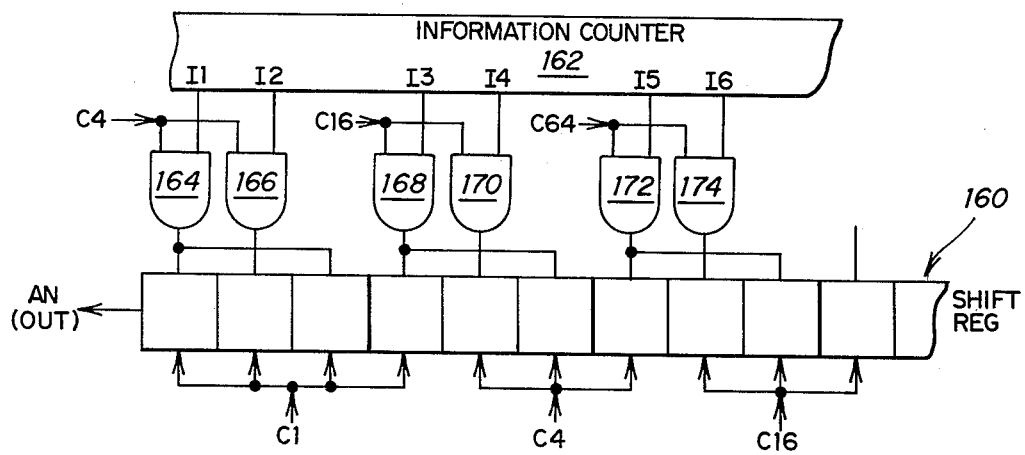
FIG. 7 is a schematic diagram of a third embodiment of a scanning circuit according to the present invention.

FIG. 7 illustrates a third embodiment of a scanning circuit in accordance with the present invention which utilizes a series shift register 160 without feedback as in the circuits shown in FIGS. 3 and 6. While the circuit shown in FIG. 7 requires more clock phases than the circuits shown in FIG. 6, the illustrated circuit of FIG. 7 requires fewer shift register stages.

Shift register 160 is illustrated in FIG. 7 as including ten shift register stages, with a clock C1 being applied to the first four stages, a clock C4 being applied to the stages 5-7 and a clock frequency C16 being applied to stages 8-10. FIG. 4 illustrates clocks C1, C4 and C16. The output of the shift register 160 comprises an AN output previously noted. The information counter 162 comprises up/down counter cells, as previously described. Data bits I1-I6 are stored in counter 162, with bit I1 being the most significant bit. Bits I1 and I2 are applied to inputs of AND gates 164 and 166, the outputs of which are connected to the first three stages of the shift register. Clock frequency C4 clocks gates 164 and 166. AND gates 168 and 170 receive data bits I3 and I4 and the outputs of the gates are applied to the second three stages of the shift register. Clock frequency C16 clocks the gates 168 and 170. In a similar manner, AND gates 172 and 174 receive data bits I5 and I6 from the information counter 162. Gates 172 and 174 are clocked by clock frequency C64 and their outputs are interconnected to the third set of three shift register stages. The remainder of the scanning circuit shown in FIG. 7 is identical to that illustrated to operate upon the remaining digital bits stored in the information counter 162.

In operation of the scanning circuit shown in FIG. 7, data bits stored within the information counter 162 are clocked through the gates 164-174 by the clock pulses into the shift register 160. Due to the varying rates of clocking applied to the gates and to the shift register stages, the resulting AN output of the shift register comprises the periodic sequence previously denoted to provide the highest possible ripple frequency for the bits stored in the information counter in dependence upon the significance of the bits.

Figure 8:
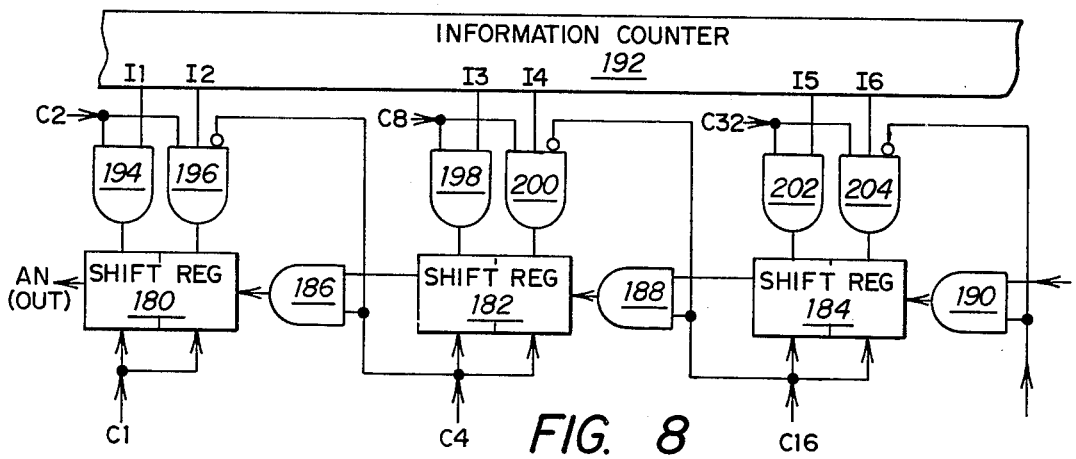
FIG. 8 is a schematic diagram of a fourth embodiment of a scanning circuit according to the invention.

FIG. 8 illustrates a fourth embodiment of a scanning circuit according to the invention. In this embodiment, three two-stage shift registers 180, 182 and 184 are respectively interconnected through AND gates 186, 188 and 190. Digital bits I1 and I2 from the information counter 192 are applied through AND gate 194 and inhibited AND gate 196 to two stages of the shift register 180. Clock frequency two drives the gates 194 and 196. Clock frequency C1 drives the two stages of the shift register 180. An input from gate 196 is connected to an input of gate 186 and to receive the clock pulse C4. AND gate 198 and inhibited AND gate 200 receive digital data bits I3 and I4 from the information counter and apply the data bits to the two stages of the shift register 182. Gates 198 and 200 are driven by clock frequency C8, while the two stages of the shift register 182 are driven by the clock frequency C4. An output of gate 200 is connected to an input of gate 188 and to receive clock frequency C16. AND gate 202 and inhibited AND gate 204 are connected to receive data bits I5 and I6 from the information counter. Gates 202 and 204 are driven by the clock frequency C32. The two stages of the shift register 184 are driven by clock frequency C16. An input of gate 204 and an input of gate 190 are connected to subsequent stages of the scanning circuit.

In operation of the circuitry shown in FIG. 8, data is clocked from the information counter 192 through the logic gates to the shift register stages. Data is then circulated through the shift register stages to provide an AN output comprising the periodic sequence previously noted in order to provide the desired high ripple frequency of the individual bits in accordance with their significance.

It will be seen that the present invention provides a plurality of scanning circuits which tend to reduce and eliminate problems resulting from prior scanning circuits utilized in digital to analog converters. In particular, the present scanning circuits of the invention do not require synchronous binary counters and associated logic gates, and thus may be constructed in accordance with conventional MOS or biopolar techniques to provide low power dissipation requirements and to enable large scale integration to reduce chip size. In addition, the present scanning circuits may be operated at much higher frequencies than previously developed scanning circuits requiring synchronous binary circuits.

Whereas the present invention has been described with respect to specific embodiments thereof, it will be understood that various changes and modifications will be suggested to one skilled in the art, and it is intended to encompass such changes and modifications as fall within the scope of the appended claims.

What is claimed is:

1. A scanning system for a digital to analog converter comprising:
    a. information register means for storing a plurality of digital bits I1, I2, I3...IN representative of a magnitude of a desired DC voltage with bit I1 being the most significant bit and IN being the least significant bit;
    b. a plurality of four stage circulating shift registers each associated with a different odd numbered one of the bits stored in said information register and with the next lower bit, said shift register associated with said most significant bit being clocked at a clock frequency of $f_c$ and each other shift register being clocked at a frequency of one-fourth the clocking frequency of the shift register associated with the next more significant bit;

c. four gates associated with each shift register each being responsive to a different output of said shift register and to a second input, the second input of the first and third of said four gates being connected with the output of said information register representing said odd numbered bit associated with said shift register, the second input of the second of said four gates being connected to the output of said information register representing said next lower bit associated with said shift register, the second input of the fourth of said four gates being connected to the output from the shift register-gate combination associated with the next lower significant bits of said information register; and d. a fifth gate responsive to the outputs of said four gates to produce an output from the shift register gate combination with which it is associated.

2. A scanning system for a digital to analog converter as defined in claim 1 wherein said four gates are AND gates and said fifth gate is an OR gate.

3. A scanning system for a digital to analog converter as defined in claim 1 wherein said each other shift register is clocked by an output of the shift register associated with the next most significant bit.

4. A scanning system for a digital to analog converter as defined in claim 3 wherein said four gates are AND gates and said fifth gate is an OR gate.

* * * * *